United States Patent [19]

Roman et al.

[11] 3,830,665

[45] Aug. 20, 1974

[54] METHOD FOR DELINEATING SEMICONDUCTOR JUNCTIONS

[75] Inventors: William Clair Roman; Larry Ray Wilson, both of Tempe, Ariz.

[73] Assignee: Motorola, Inc., Franklin Park, Ill.

[22] Filed: Dec. 7, 1972

[21] Appl. No.: 313,010

[52] U.S. Cl. ........................ 156/7, 156/17, 252/79.3
[51] Int. Cl. ............................................ H01l 7/50
[58] Field of Search ............ 29/583; 156/7, 17, 345; 317/234, 235; 252/79.3

[56] References Cited

UNITED STATES PATENTS

| | | | |
|---|---|---|---|
| 2,930,949 | 3/1960 | Roschen | 156/17 X |
| 3,163,568 | 12/1964 | Mieux | 156/17 |
| 3,355,568 | 11/1967 | Tadamasa Hirai et al. | 29/583 X |

*Primary Examiner*—William A. Powell
*Attorney, Agent, or Firm*—Vincent J. Rauner; Henry T. Olsen

[57] ABSTRACT

A method for etching a groove along a junction between regions of semiconductor material having different dopant concentrations to delineate or isolate the regions forming the junction. Standard concentrations of sirtl etch are used in conjunction with infrared radiation. Wafers in a holder are placed in a container of sirtl etch and exposed to infrared radiation. Preferential etching creates a groove at the semiconductor junction.

19 Claims, 4 Drawing Figures

PATENTED AUG 20 1974

3,830,665

METHOD FOR DELINEATING SEMICONDUCTOR JUNCTIONS

BACKGROUND OF THE INVENTION

1. Field of the Invention

The invention relates to methods of delineating semiconductor junctions or isolating regions of semiconductor material and particularly to methods of electrolessly etching semiconductor material to delineate semiconductor junctions or isolate regions of semiconductor material. More particularly, the invention relates to use of infrared radiation to enhance a preferential etching of a sirtl etchant at a semiconductor junction.

2. Description of the Prior Art

There has long been a requirement in the semiconductor industry for efficient methods of delineating semiconductor junctions to allow various evaluations thereof or for conveniently delineating semiconductor junctions to facilitate subsequent mask alignment thereto. In the prior art, bevel and stain procedures have been commonly used for evaluation of semiconductor junctions. This is a destructive evaluation technique in which a portion of the semiconductor wafer is removed and mounted on a handle, usually using a hard wax. A grinding compound is then used to bevel or grind the portion of semiconductor at an angle to suitably expose the semiconductor junction. Then, an appropriate staining compound is applied to the beveled region. For several of the staining compounds used, a visible material plates out on one side of the junction and not on the other, thereby delineating the junction. Various acid staining compounds which delineate the junction have also been used. However, no single stain works well for a wide range of doping concentrations in silicon. Further, it has been difficult to use bevel and stain methods to reliably delineate semiconductor junctions between similar type materials, such as NN+ or PP+ junctions. Moreover, bevel and stain techniques are very labor intensive, and are not well suited to a high volume production environment. Methods of electrolytically etching the surface of semiconductor material are known, wherein the etchant etches along a grain boundary or etches a region of semiconductor material of relatively low resistivity. However, these methods require attaching an electrode to the semiconductor material and immersing an electrode in the etchant, and result in removal of a large amount of semiconductor material on one side of the semiconductor junction, whereas it is desirable to remove only a groove in the semiconductor material to delineate a junction therein.

The present invention eliminates the aforementioned shortcomings of the prior art by providing an electroless (i.e., nonelectrolytic) method in which a narrow, well defined, highly visible groove is etched along the semiconductor junction without creating a step, and not requiring electrolytic etching techniques, which is suitable for batch processing, and which provides suitable delineation in as little as 5 seconds for a wide range of dopant concentrations in the semiconductor material. Further, in some structures the groove may be etched sufficiently deep to electrically isolate the regions of semiconductor material forming the junction.

SUMMARY OF THE INVENTION

In view of the foregoing considerations, it is an object of this invention to provide a method of etching a groove for delineating a semiconductor junction.

Another object of the invention is to provide a method of delineating a semiconductor junction wherein a groove is etched along the semiconductor junction which is readily visible using ordinary white field microscopes used in the semiconductor industry.

Yet another object of the present invention is to provide a junction delineation method as described wherein semiconductor material remote from the PN junction is not significantly removed.

Another important object of the invention is to provide a junction delineation technique of the type described wherein infrared radiation is utilized to enhance etching along the semiconductor junction.

Another object of the invention is to provide a method of etching a groove along a semiconductor junction sufficiently deep to electrically isolate the regions of semiconductor material forming the junction for certain structures.

Briefly described, the invention provides an improved method of preferentially etching a groove in a body of semiconductor material along a semiconductor junction therein to clearly delineate the junction. Semiconductor wafers are immersed in a container of sirtl etch and simultaneously exposed to infrared radiation, which causes a photochemical reaction which preferentially etches along the semiconductor junction, forming a visible groove thereat. The delineation of the semiconductor junction obtained thereby is used to evaluate the semiconductor junction or to aid for subsequent mask alignment steps. Further, the groove delineating the junction may provide improved leakage and breakdown characteristics in the case of PN semiconductor junctions. Also, the groove may be etched deep enough in some structures to electrically isolate regions of semiconductor material forming the junction.

DESCRIPTION OF THE INVENTION

Figure 1:
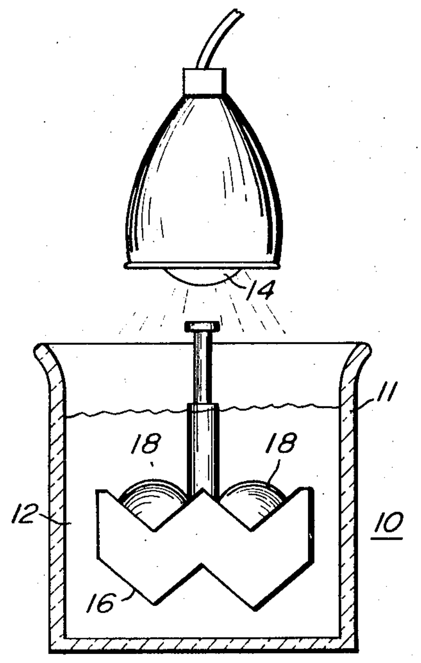
FIG. 1 is a drawing of apparatus that may be used to practice the method of present invention.

The invention provides an improved method of delineating a semiconductor junction by preferentially etching a groove along the semiconductor junction. Semiconductor wafers are dipped in a container of sirtl etch and simultaneously exposed to infrared radiation. The infrared radiation is thought to cause a photochemical reaction which preferentially etches a groove along a semiconductor junction. The single apparatus illustrated in FIG. 1 may be utilized to practice the invention. The etching apparatus 10 includes a container 11 having therein a quantity of sirtl etchant 12. An infrared light source 14 is positioned directly over the container 11 and the emitted infrared light is propagated through the sirtl etchant 12 and strikes the semiconductor wafer. Semiconductor wafers 18, which have therein the semiconductor junctions which are to be delineated, are stacked in a conventional wafer holder 16, and are submerged below the surface of the etchant 12 for a specific period of time. Infrared light source 14 may be a conventional 250 watt infrared lamp. Sirtl etchant 12 is a solution including chromium trioxide and hydrofluoric acid which may be prepared as follows. Chromium trioxide is mixed with deionized water in the ratio of three mililiters of deionized water to 1 gram of chromium trioxide crystals. This chromium trioxide solution is then diluted with standard concentration hydrofluoric acid (HF) in the ratio of ten parts of chromium trioxide solution to one part of hydrofluoric acid. (Other proportions of chromium trioxide, deionized water, and hydrofluoric acid may also be used, and are all called sirtl etchants). With the infrared lamp turned on, and the radiation directed into the beaker, the wafer holder 6 and wafers 18 therein are placed into the etchant so that the wafers 18 are completely submerged for a period of time which, for example, may range from 5 to 30 seconds. The wafers are then removed from the etchant solution and are placed in running deionized water and rinsed for approximately 5 minutes or until the orange etchant color disappears from the water. The wafers are then rinsed in alcohol and dried. The PN junction delineations may then be easily seen under a microscope at 100X magnification.

Figure 2:
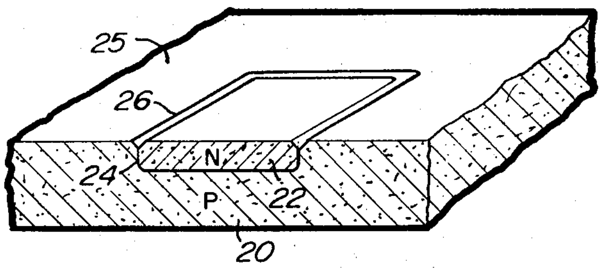
FIG. 2 is a perspective diagram of a wafer of semiconductor material having a PN junction which has been delineated according to the method of the invention.

For example, the delineation of a PN junction subsequent to the above-described infrared-radiated sirtl etching procedure may appear as shown in FIG. 2, wherein P region 22 in N-type semiconductor body 20 forms a PN junction 24. PN junction 24 terminates on upper surface 25 of N-type semiconductor 20. As a result of the infrared illuminated etching procedure previously described, groove 26 is formed at the termination of PN junction 24 in upper surface 25, thereby delineating the PN junction 24.

Sirtl etchants have been widely used in the semiconductor industry to detect imperfections in silicon such as surface damage, dislocations, etc. In the course of the invention it was found that etching a silicon wafer having exposed PN junctions in sirtl etchant, prepared as previously described herein, at room temperature and under ordinary room lighting conditions results in a slight preferential etching along the exposed PN junctions. This effect was observed on PN junctions, but not on semiconductor junctions between similar regions, such as NN+ or PP+ junctions. Further, it was discovered that the simultaneous etching of surface damage on the wafer occurs to such an extent for the long periods of time required to provide useful delineation (approximately 5 minutes) that it renders the wafer less suitable for producing useful semiconductor devices.

It was further found in the course of the invention that in the total absence of light, no delineation of the junction occurs. However, it was discovered that if collimated white light is directed perpendicularly to the surface of a silicon wafer submerged in sirtl etchant so that only a very shallow layer of sirtl etchant lies over the surface of the wafer in which the PN junction terminates, improved delineation of the junction occurs. By experimenting with various light filters, it was then discovered that if the white light is filtered with an infrared filter, the aforementioned enhancement of preferential etching at the PN junction is eliminated. It was then discovered that if a conventional 250 watt infrared lamp is used to illuminate the semiconductor wafers during sirtl etching thereof, a dramatic difference in the etching rate along the junction (at room temperature) occurs. For example, it was found that a groove 0.5 microns deep is preferentially etched along a PN junction in less than 30 seconds, thereby providing very visible junction delineation at 100X magnification. It was further found that such delineation occurs over a broad range of doping concentrations for both P-type and N-type material, including NN, NN+, NP, PP and PP+ silicon junctions. Good junction delineation occurred for the range of doping concentrations investigated, from $5 \times 10^{14}$ atoms per cubic centimeter to $10^{19}$ atoms per cubic centimeter (corresponding to a resistivity range from 27 ohm-centimeters to 0.01 ohm-centimeters) for P-type silicon. For N-type silicon the range of doping concentrations investigated was $2.5 \times 10^{14}$ atoms per cubic centimeter to $5 \times 10^{18}$ atoms per cubic centimeter, corresponding to resistivities in the range from 20 ohm-centimeters to 0.01 ohm-centimeters. Within this range of doping concentrations for P-type and N-type silicon, a matrix of N, NN+, NP, PP and PP+ junctions were used to study the junction delineation properties of the above-described infrared illuminated sirtl etching procedure. The range of etching time used in the experiments included a time as short as a quick dip in the etchant followed by the rinse to as high as three minutes, followed immediately by the rinse. The range in the ratio of the concentrations of chromium trioxide solution (prepared as previously described herein) to standard concentrated hydrofluoric acid varied from 10:1 to 1:1. The range of intensity of infrared radiation varied from the amount available in ordinary room lighting conditions to that of a 250 watt General Electric infrared heating lamp at a distance of about 10 inches from the container 11 in FIG. 1. The range of temperatures in the experiments varied from room temperature to 100° centigrade. The best results for the purpose of obtaining junction delineation suitable for alignment of a photomask to the delineated junction resulted from the use of a 10:1 ratio of chromium trioxide solution to standard concentrated hydrofluoric solution and a 150 to 250 watt General Electric heater lamp, the etchant solution being at room temperature. At higher temperatures or at higher concentrations of sirtl etchant it has been found that increased etching of the surface work damage result.

The deepness of the groove has been shown to be directly related to the intensity of the infrared radiation.

Sirtl etchants by nature will attack a "high energy" area of silicon. A "high energy" area is an area wherein the electric fields are high. For example, areas where work damage or crystal defects appear at the surface of a wafer are high energy areas, since high electric field intensity occurs at the irregularities in the crystal structure caused by work damage, crystal slippage, dislocations, etc. Therefore, sirtl etchant effectively delineates work damage and other irregularities in the crystal lattice structure.

Since sirtl etchant has been found to delineate a semiconductor junction by preferentially etching silicon thereat in the presence of infrared radiation, it is thought that the infrared radiation in this case causes the junction to become a high energy area. It is thought that the radiation, according to a well known quantum mechanical effect, stimulates the flow of carriers across the junction barriers, thereby setting up an increased potential drop across the junction, thereby increasing the electric field intensity in the region defined by the depletion regions of the junction. The electric field in the junction region may be approximately the same as if the junction is forward biased at very low current. Therefore, the sirtl etchant preferentially etches the region within the depletion regions of the semiconductor junction stimulated by infrared radiation, as illustrated in FIG. 3-*b*.

Figure 3:
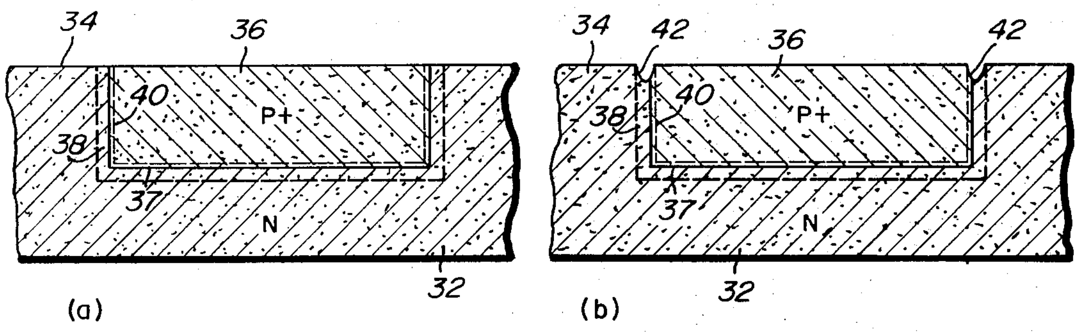
FIGS. 3-*a* and 3-*b* are cross sectional diagrams of a PN junction which are helpful in explaining the invention.

FIG. 3 shows a cross sectional diagram of a structure including an N-type silicon body 32 having an upper surface 34 and a heavily doped P+ region 36 within surface 34. P+ region 36 forms a PN junction 37 with N-type body of silicon 32, PN junction 37 terminating at surface 34. The part 38 of the junction depletion region extends further into the more lightly doped N-type body 32 than the part 40 of the junction depletion region extends into the heavily doped P+ region 36. FIG. 3-*b* shows the structure after a delineation etch performed as previously described herein, using sirtl etchant and illumination by an infrared light source. Referring to FIG. 3-*b*, the groove 42 extends approximately across the total depletion region consisting of part 38 in N-type body of silicon 32 and part 40 in P+ region 36.

The effect of the delineation etch on electrical characteristics of a junction has not been completely determined to date, except that it is established that they are not significantly degraded. In fact, there is some evidence to support the view that there should be some measurable improvement of junction characteristics, especially reverse breakdown voltage and reverse leakage current.

Batch processing techniques are readily usable according to the method of the invention; junctions on as many as 60 wafers have been successfully delineated in a single container in less than 30 seconds, when the infrared source 14 in FIG. 1 is a 250 watt infrared lamp placed approximately 10 inches over the container 11. The wafers 18 were stacked side-by-side one quarter of an inch apart in the wafer holder 16. Apparently, a sufficient amount of infrared radiation is diffused and reflected in the etchant solution between the wafers to cause an adequate electric field across the junction to enhance etching thereat.

It will be readily apparent to those skilled in the art that radiation having wavelengths outside of the infrared spectrum may be required to optimize the etch rate at semiconductor junctions formed by semiconductor materials different than those described herein in the preferred embodiment, since it is well known that the generation of hole-electron pairs in semiconductor material by absorbed radiation requires wavelengths corresponding to available energy states in the semiconductor material. For example, use of visible light to enhance etching with a suitable etchant to delineate a junction in gallium arsenide or gallium phosphide is within the scope of the invention.

Figure 4:
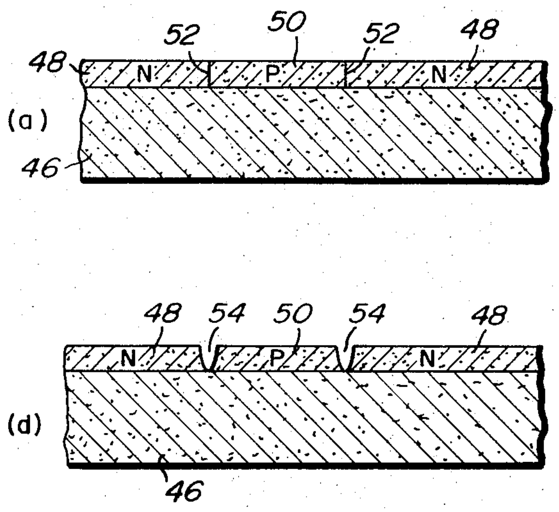
FIGS. 4-*a* and 4-*b* are diagrams of another semiconductor structure etched according to the method of the invention.

The depth of the groove etched along the semiconductor junction may be much deeper than is required to merely delineate the junction. Using the simple apparatus as previously described herein, grooves deeper than 10 microns have been etched along semiconductor junctions in periods of several minutes in duration. (However, the extent to which work damage is delineated for such long etching times may make the semiconductor wafer less suitable for fabrication of certain semiconductor devices). Within the scope of this invention, a groove may be etched sufficiently deep along a semiconductor junction in some structures to electrically isolate the regions forming the semiconductor junction. For example, as shown in FIG. 4-*a* a thin layer 48 of N-type silicon on an insulating substrate 46 may have a P-type region 50 diffused therein and forming a PN junction 52 therewith and extending completely through the N-type layer 48 to the insulating substrate 46. According to the present invention, the P-type region 50 may be electrically isolated from the N-type layer 48 by etching a groove 54 along the PN junction 52, extending completely through the semiconductor layer to reach the insulating substrate 46, using a suitable etchant and a radiation source of appropriant intensity and wavelength.

Further, etchants such as gas etchants may be utilized in place of liquid etchants within the scope of the invention. For example, the container 14 in the drawing may be a closed system including a reactor tube such as those commonly used for diffusion and gas etching in the semiconductor industry. The etchant may be a gaseous etchant which attacks high energy regions of a semiconductor rather than a liquid etchant having said properties.

Thus, while this invention has been shown in connection with various specific examples, it will be readily apparent to those skilled in the art that various changes in form and arrangement of parts may be made to suit specific requirements without departing from the spirit and scope of the present invention.

What is claimed is:

1. A method for etching a groove along a semiconductor junction in a body of semiconductor material comprising the steps of exposing the semiconductor junction to an etchant, and exposing the semiconductor junction to radiation during the exposure to said etchant.

2. The method for etching a groove along a semiconductor junction as recited in claim 1 wherein the semiconductor junction is exposed to infrared radiation.

3. The method for etching a groove along a semiconductor junction as recited in claim 1 wherein the etching is electroless.

4. The method for etching a groove along a semiconductor junction as recited in claim 1 wherein said etchant has the characteristic that it preferentially etches high energy areas of the body of semiconductor material.

5. The method for etching a groove along a semiconductor junction as recited in claim 2 wherein said etchant is sirtl etchant.

6. The method for etching a groove along a semiconductor junction as recited in claim 1 wherein the semiconductor junction is a PN junction.

7. The method for etching a groove along a semiconductor junction as recited in claim 1 wherein the semiconductor junction is formed by first and second regions having different concentrations of the same type dopant.

8. The method for etching a groove along a semiconductor junction as recited in claim 1 wherein the groove is etched sufficiently deep to adequately delineate the semiconductor junction.

9. The method for etching a groove along a semiconductor junction as recited in claim 4 wherein:

said semiconductor junction is formed by silicon semiconductor material;

said etchant is a solution of chromium trioxide solution and standard concentrated hydrofluoric acid, the chromium trioxide solution consisting essentially of chromium trioxide solution and deionized water in the ratio of approximately one gram to three mililiters, the ratio of said chromium trioxide solution to standard concentrated hydrofluoric acid being between ten to one and one to one.

10. The method for etching a groove along a semiconductor junction as recited in claim 4 wherein P-type silicon having a doping concentration in the range from $5 \times 10^{14}$ atoms per cubic centimeter to $10^{19}$ atoms per cubic centimeter is the material on one side of said semiconductor junction.

11. The method for etching a groove along a semiconductor junction as recited in claim 4 wherein N-type having a doping concentration between $2.5 \times 10^{14}$ atoms per cubic centimeter and $5 \times 10^{18}$ atoms per cubic centimeter.

12. The method for etching a groove along a semiconductor junction as recited in claim 4 when the temperature of the etchant solution is between 25° centigrade and 100° centigrade.

13. The method for etching a groove along a semiconductor junction as recited in claim 1 wherein the groove is etched sufficiently deep to electrically isolate the regions of semiconductor material forming the semiconductor junction.

14. The method as recited in claim 1 wherein the body of semiconductor material has the [111] crystal structure.

15. The method as recited in claim 1 wherein the body of semiconductor material has the [100] crystal structure.

16. The method for etching a groove along a semiconductor junction as recited in claim 1 wherein said etchant is a gaseous etchant.

17. A method for delineating a semiconductor junction in a semiconductor wafer by electrolessly etching a groove along the semiconductor junction comprising the steps of:

providing a infrared lamp positioned directly over a container of sirtl etchant, said infrared lamp emitting infrared light into said sirtl etchant, and placing the semiconductor wafer in a wafer holder;

submerging said wafer holder in said etchant so that the semiconductor wafer is completely submerged for a specified time.

18. The method as recited in claim 13 wherein said specified time is less than 30 seconds.

19. The method as recited in claim 13 wherein said wafer is removed from said sirtl etchant, rinsed and dried.

* * * * *